US012009845B2

(12) United States Patent
Trautmann et al.

(10) Patent No.: US 12,009,845 B2
(45) Date of Patent: Jun. 11, 2024

(54) CONCEPT FOR AN RF FRONTEND

(71) Applicant: Intel Corporation, Santa Clara, CA (US)

(72) Inventors: Steffen Trautmann, Villach (AT); Alexander Kahl, Villach (AT); Thomas Niederfriniger, Villach (AT); Harald Enzinger, Villach (AT)

(73) Assignee: Intel Corporation, Santa Clara, CA (US)

( * ) Notice: Subject to any disclaimer, the term of this patent is extended or adjusted under 35 U.S.C. 154(b) by 819 days.

(21) Appl. No.: 16/928,309

(22) Filed: Jul. 14, 2020

(65) Prior Publication Data
US 2022/0021406 A1    Jan. 20, 2022

(51) Int. Cl.
*H04B 1/04*    (2006.01)
*H04B 1/62*    (2006.01)
*H04L 5/14*    (2006.01)

(52) U.S. Cl.
CPC .......... *H04B 1/04* (2013.01); *H04B 1/62* (2013.01); *H04L 5/14* (2013.01); *H04B 2001/0416* (2013.01); *H04B 2001/0425* (2013.01)

(58) Field of Classification Search
CPC .......... H04B 1/0475; H04B 1/62; H04B 2001/0416; H04B 2001/0425; H04B 2001/0433; H04L 5/14
See application file for complete search history.

(56) References Cited

U.S. PATENT DOCUMENTS

| | | | | |
|---|---|---|---|---|
| 6,816,091 B1* | 11/2004 | Chee | .................. | G01D 5/36 |
| | | | | 341/13 |
| 6,909,756 B1* | 6/2005 | Nakajima | ............. | H03F 1/3247 |
| | | | | 327/317 |
| 7,529,524 B1* | 5/2009 | Giallorenzi | ........... | H03F 1/3247 |
| | | | | 375/295 |
| 8,295,396 B2* | 10/2012 | Waheed | ............... | H03G 3/3047 |
| | | | | 375/377 |
| 8,326,238 B2* | 12/2012 | Yang | ...................... | H03F 3/245 |
| | | | | 455/114.2 |
| 9,209,841 B2* | 12/2015 | Yu | ......................... | H04B 1/0475 |
| 9,762,268 B2* | 9/2017 | Yang | ..................... | H04L 27/368 |
| 10,243,596 B1* | 3/2019 | Kerhuel | .............. | H04L 27/2646 |
| 11,129,076 B2* | 9/2021 | Kim | ..................... | H04W 40/02 |

(Continued)

FOREIGN PATENT DOCUMENTS

WO    WO-0163791 A2 *    8/2001    ........... H03F 1/3241

*Primary Examiner* — Sophia Vlahos
(74) *Attorney, Agent, or Firm* — 2SPL Patent Attorneys PartG mdB; Yong Beom Hwang

(57) ABSTRACT

Examples relate to a concept for a Radio-Frequency (RF) frontend, and for a communication device comprising such an RF frontend. A radio-frequency frontend apparatus comprises a receive branch, comprising circuitry configured to obtain a received signal and a digital pre-distortion feedback signal from an external transceiver device. The radio-frequency frontend apparatus comprises power measurement circuitry configured to generate a first signal that represents a power of the received signal based on the received signal, and to generate a second signal that represents a power of an amplified signal based on the digital pre-distortion feedback signal, the amplified signal being a signal that is amplified by a power amplifier of the external transceiver device.

23 Claims, 10 Drawing Sheets

(56) References Cited

U.S. PATENT DOCUMENTS

| | | | |
|---|---|---|---|
| 2007/0142019 A1* | 6/2007 | Mattisson | H03D 7/1441 |
| | | | 455/327 |
| 2007/0190952 A1 | 8/2007 | Waheed et al. | |
| 2008/0144707 A1* | 6/2008 | Tsfati | H04B 17/13 |
| | | | 455/127.2 |
| 2016/0105299 A1 | 4/2016 | Chee et al. | |
| 2018/0262231 A1 | 9/2018 | Pusl, III et al. | |
| 2021/0036724 A1* | 2/2021 | Lam | H03G 3/3042 |

* cited by examiner

CONCEPT FOR AN RF FRONTEND

FIELD

Examples relate to a concept for a Radio-Frequency (RF) frontend, and for a communication device comprising such an RF frontend.

BACKGROUND

In some implementations, RF Frontends (RFIC) for WiFi Access Point (AP) applications in home gateways or wireless routers do not include/implement the TX (Transmit) Power Amplifier (PA) and the RX (Receive) Low-Noise Amplifier (LNA). The stringent requirements to TX output power and linearity, and RX Noise Figure (NF), respectively, might not be achieved in CMOS (Complementary Metal-Oxide-Semiconductor) technology. Instead, to complete the WiFi (Wireless Fidelity) chipset, some manufacturers rely on third-party vendors developing external Front-End Modules (FEM) with integrated PA and LNA in special high-voltage technologies. Such FEMs typically also include a power detector at the PA output for TX power measurement (Transmit Signal Strength Indication—TSSI). The integrated TSSI detector may deliver a DC voltage information proportional to the PA output power which is used to adjust the TX gain settings to exactly meet the desired output power at the antenna port.

BRIEF DESCRIPTION OF THE FIGURES

Some examples of apparatuses and/or methods will be described in the following by way of example only, and with reference to the accompanying figures, in which.

DETAILED DESCRIPTION

Figure 1A:
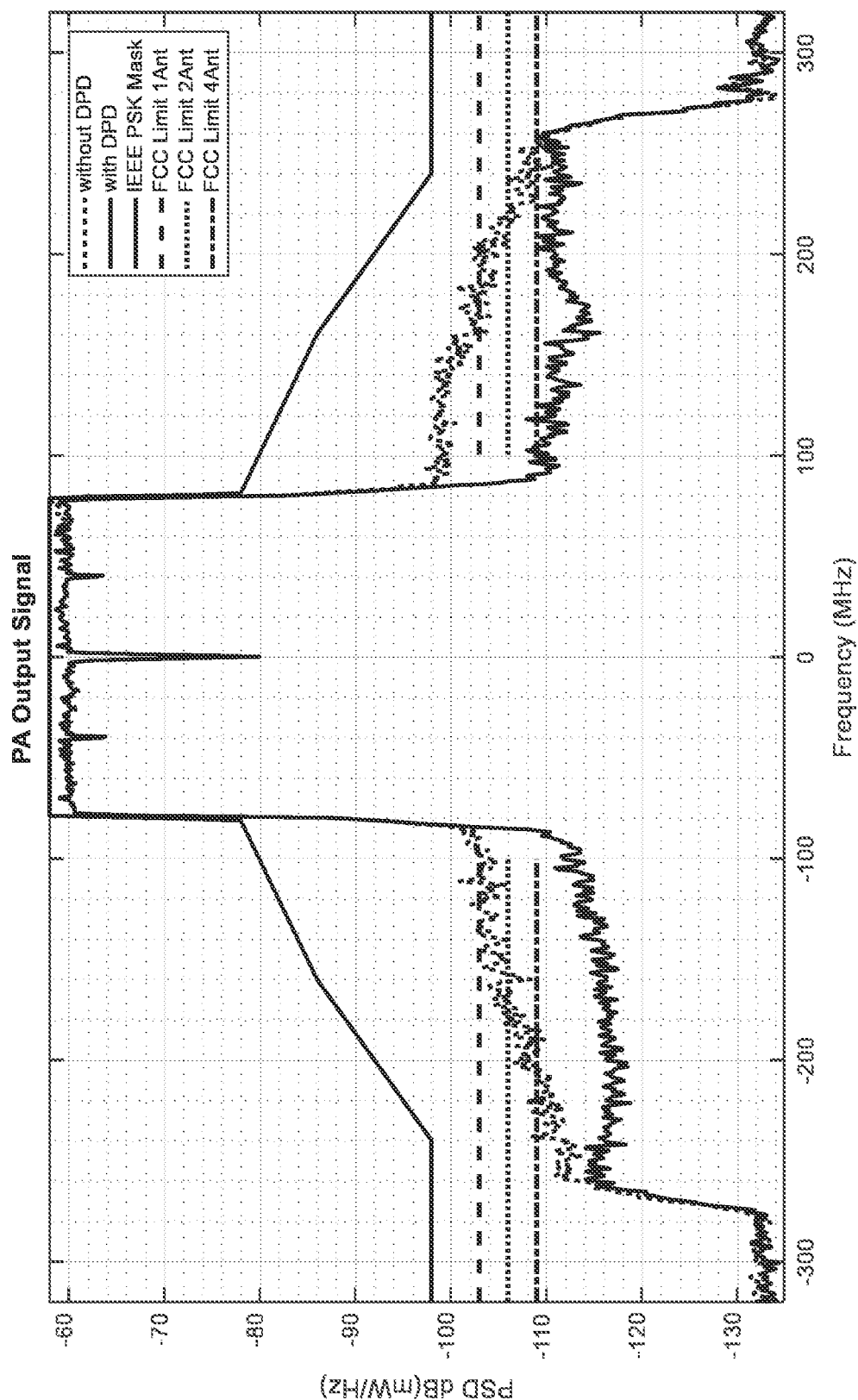
FIG. 1a shows a diagram of a PSD over an exemplary spectrum for WiFi.

Some examples are now described in more detail with reference to the enclosed figures. However, other possible examples are not limited to the features of these examples described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Various examples of the present disclosure relate to using the WiFi (Wireless Fidelity) RFIC (Radio Frequency Integrated Circuit) Digital Pre-Distortion (DPD) Feedback Path for TX (Transmit) Signal Strength Indication (TSSI) Operation.

Like many other wireless communications, WiFi transmitted signals are required to fulfill certain limits regarding their Power Spectral Density (PSD) level, inside the transmission band and especially also outside the band. Nonlinear behavior of the blocks in the transmission chain naturally causes leakage of signal energy which is typically the strongest near the band edge and then decreases. The IEEE (Institute of Electrical and Electronics Engineers) WiFi standard defines a PSD (Power Spectral Density) limit mask, which is shaped to follow that natural behavior of typical nonlinear WiFi blocks. This mask applies to all channels in a given WiFi band—like 2.4 GHz or 5 GHz—the same. Compliance to this mask may therefore determine the maximum power the WiFi transmitter is allowed to transmit. Regulation authorities like the US Federal Communications Commission (FCC) define even more stringent limits outside the WiFi band in order to secure non-WiFi transmission from unwanted WiFi signal leakage. Accordingly, WiFi channels at the band edges of a WiFi band are typically further limited in maximum signal power. Typical PSD limits according to IEEE and FCC are illustrated in FIG. 1a. FIG. 1a shows a diagram of a PSD over an exemplary spectrum for WiFi 160 MHz incl. IEEE PSD mask and FCC limits.

Figure 1B:
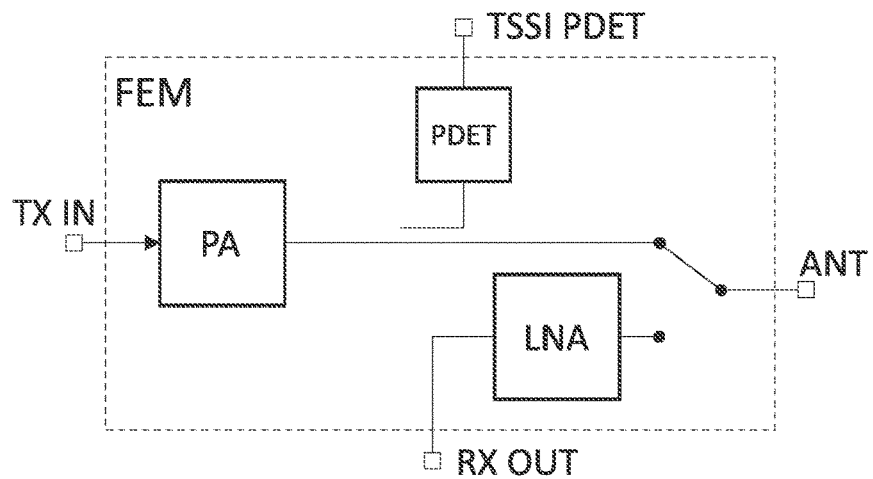
FIGS. 1b to 1d show schematic diagrams of variants of a front-end module.

While the out-of-band (OOB) signal leakage behavior versus transmit output power is typically known, the actual output power at the antenna is not. Gain variation over temperature and channel frequency of the RF blocks in the chain, and impedance change of the antenna may cause an uncertainty of the actual output power of up to several dB. Reducing the maximum output power by this uncertainty to make sure that the PSD mask limit is fulfilled under all circumstances would cause a significant drop in reach and data throughput. Therefore, most of today's WiFi chipset may integrate an auxiliary path, so-called Transmit Signal Strength Indication (TSSI) path, to actively measure the transmit power at the PA output, and dynamically adjust the TX gains to minimize the delta between desired and actual output power. To support this method, third-party FEMs may integrate a directional coupler at the PA output, connected to a power detector which generates a DC voltage as a function of the measured power level. This legacy-type of FEM is illustrated in FIG. 1b.

Considering the limitations in maximum output power due to PSD mask requirements, Digital Pre-Distortion (DPD) becomes an increasingly important feature for WiFi. Closed-loop calibration of the DPD, however, may require a (second) feedback path at the PA output, to feed the distorted RF signal at the very end of the TX chain back to the digital baseband for fitting the DPD coefficients. In general, it may not be desired to use the same directional coupler that is used for TSSI detection for this purpose. With increasing signal bandwidth, Digital Pre-Distortion (DPD) becomes more and more important to reduce the nonlinearities and memory effects in the TX path. Therefore, DPD may be implemented in a WiFi digital baseband chip, e.g. for WiFi 6. Calibrating the DPD in closed-loop operation may use one additional coupler at the PA output in series to the coupler/detector used for TSSI functionality. RFICs for DPD operation may feature a separate RF input with typically programmable attenuation where the additional coupler output from the FEM is connected to.

Figure 1C:
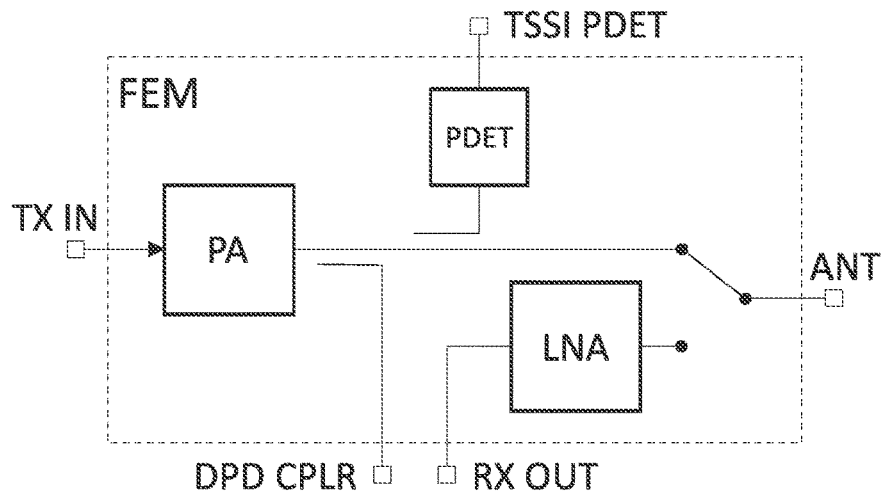

FEM vendors may add a second directional coupler in series to the output of the PA, as illustrated in FIG. 1c. This approach worked for 11ac-compatible FEMs and the first generation of 11ax devices with compromises in performance. Each coupler at the PA output may degrade directivity and insertion loss of the PA-to-antenna connection, and FEM vendors try to avoid having TSSI detector and DPD coupler—i.e. two couplers in series—in a single FEM. Instead, to reduce design effort and avoid potential performance losses, an "either-or" approach may be chosen—one FEM variant with a TSSI output only, and one FEM variant with a DPD coupler only.

Figure 1D:
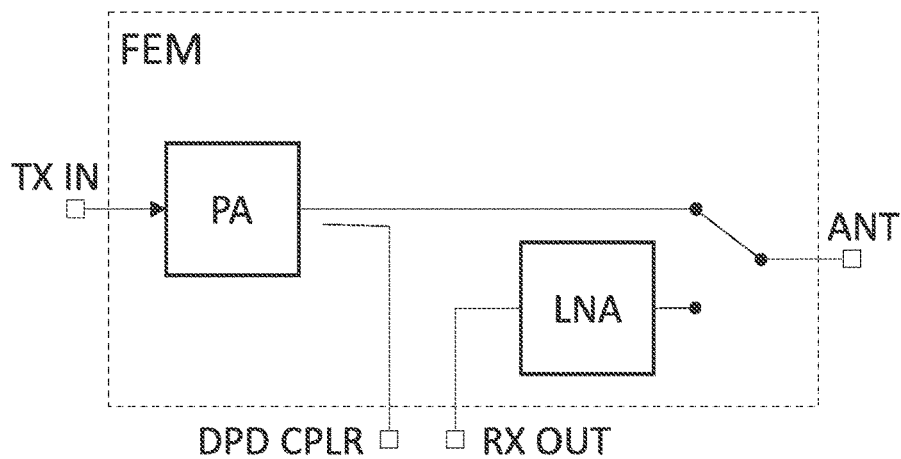

But the new generation of 6 GHz-capable FEMs, and especially FEMs with power-efficient PA architectures applying power combiners at the final amplifier stage may suffer too much from two directional couplers in series. For future, power-efficient PAs with dedicated architecture and/or the 6 GHz frequency range, the combination of both outputs in one FEM might no longer be possible without significant performance losses. FEM vendors might no longer offer the combined solution as shown in FIG. 1c, but only offer either a FEM with integrated TSSI detector as in FIG. 1b, or a FEM with DPD support as shown in FIG. 1d. FIGS. 1b to 1d show schematic diagrams of variants of a front-end module. FIGS. 1b to 1d may show possible FEM Variants. FIG. 1b may show a legacy FEM with TSSI support, FIG. 1c a FEM with combined TSSI and DPD support, and FIG. 1d a power-efficient FEM with DPD support only. Various examples of the present disclosure may provide closed-loop TSSI operation, regardless of which FEM type is used. FEMs with or without an integrated TSSI connector may be used, and the power consumption in both cases may remain approximately the same. In various examples, a usage of the RX analog/digital baseband during TX operation may be avoided.

The proposed concept may enable the flexibility to connect to FEMs of type c) (FIG. 1d) and still fully support TSSI-guided gain adjustment, with negligible increase in power consumption in the RFIC and minimum additional design effort and area increase. For example, an FEM may be connected to a WiFi chipset, with the FEM only providing an RF coupler at the PA output but no integrated TSSI detector, and the RF coupler may be connected to a dedicated DPD feedback input of the WiFi chipset.

There are several approaches for working around the limitation of having only a single coupled within the FEM. One approach would be to skip the integrated TSSI detector, use a FEM with a DPD coupler only and run TX without closed-loop power control. TX gain control may then run in open-loop operation with no feedback information on the actual power at the antenna. To avoid a PSD (Power Spectral Density) violation, a certain margin to the desired power may be left to make sure that the actual output power does not override this value. This may lead to performance degradation.

Another approach would be to skip the closed-loop DPD operation, use FEM with TSSI output only and run DPD with offline-calibrated coefficients. Running DPD in open-loop operation without regularly updating the DPD coefficients may work for standard PAs which are relatively linear by default. For the targeted power-efficient PAs with mandatory DPD support, open-loop DPD with fixed coefficients may not be enough to meet the performance targets.

Yet another approach would be to use a FEM with a DPD coupler, and in regular TX operation apply digital power detection on the received signal from the DPD feedback path. In this case, the complete receiver including the digital baseband would have to run in wideband mode also during TX operation. Power consumption would be way higher than in the regular TSSI operation where the DC-voltage TSSI signal from the FEM is measured using a low-power auxiliary xSSI (RSSI and/or TSSI) path.

A further approach would be to use a FEM with an integrated TSSI detector and add an external coupler at the Antenna output of the FEM to feed back the TX signal to the DPD FB input of the RFIC. In this case, an additional attenuator may be required to not overload the RFIC input. Different from the FEM-integrated DPD coupler which sits directly at the PA output before the integrated TX/RX switch, the additional external coupler would be placed in the path from the FEM output to the Antenna and would affect both, TX and RX performance. It may cause a loss in TX power and RX sensitivity and degrade directivity in both directions. Furthermore, the need for an additional external component may increase the BOM (bill of material) costs for this approach.

Examples of the present disclosure provide an approach for WiFi RFICs that use both the TSSI information for closed-loop TX power control and DPD in closed-loop operation with FEMs that provide only one of the two outputs.

Figure 2A:
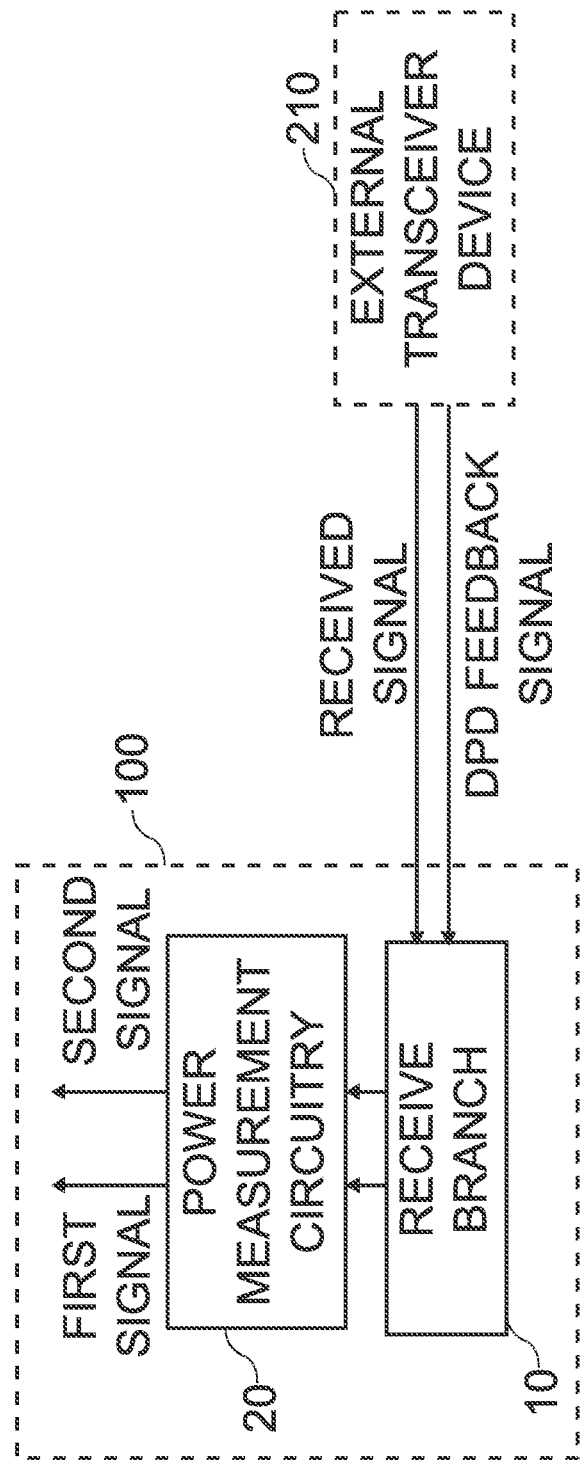
FIGS. 2a and 2b show block diagrams of examples of a radio-frequency frontend apparatus or device.
Figure 2B:
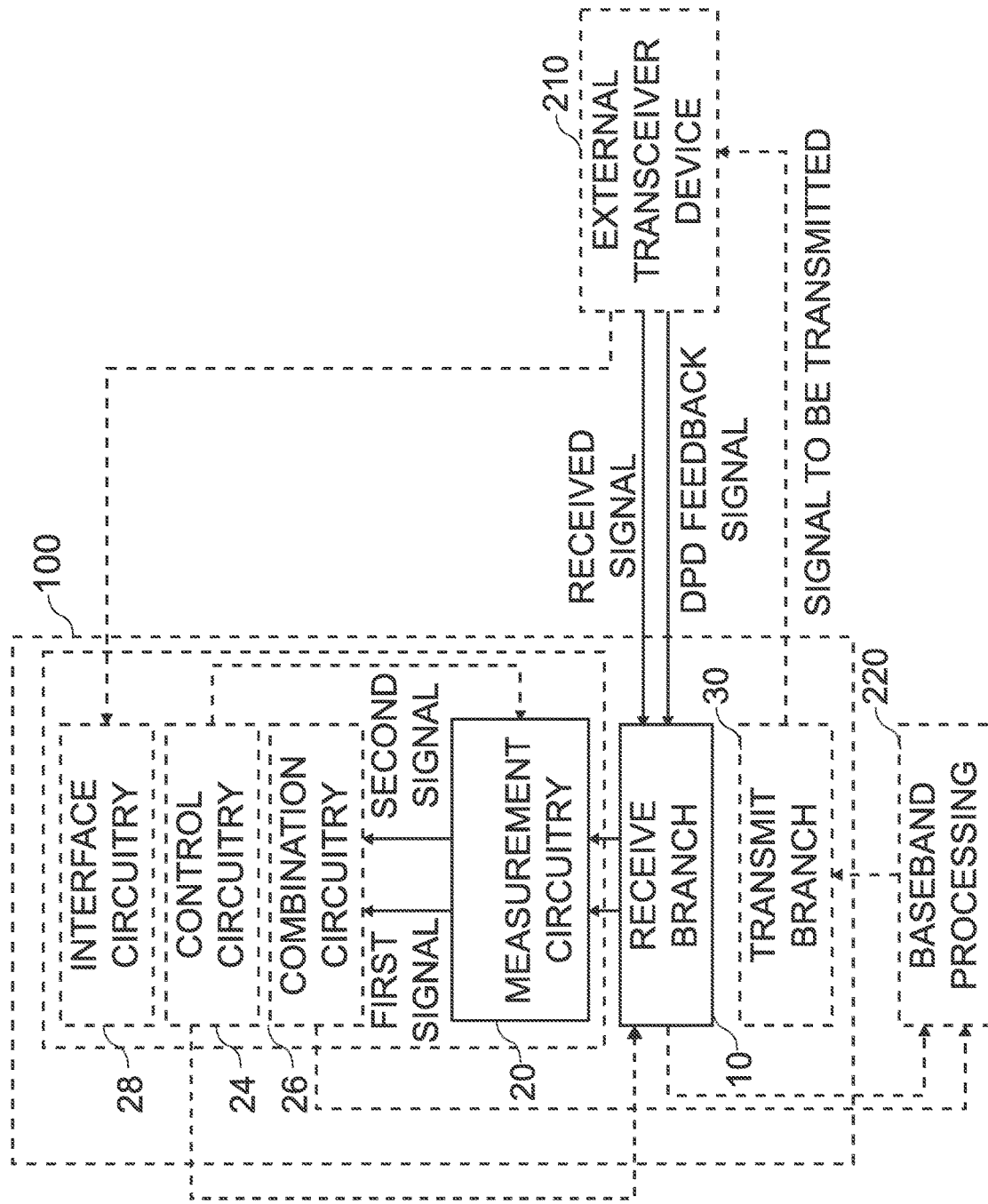

FIGS. 2a and 2b show block diagrams of examples of a radio-frequency frontend apparatus 100 or radio-frequency frontend device 100. The components of the radio-frequency frontend device 100 are defined as component means, which correspond to the respective structural components (i.e. circuitry) of the radio-frequency frontend apparatus 100. In the following, the corresponding circuitry and means are introduced together. The radio-frequency frontend apparatus/device 100 comprises a receive branch 10, comprising circuitry/means configured to obtain a received signal and a digital pre-distortion feedback signal from an external transceiver device 210. The radio-frequency frontend apparatus/device 100 further comprises power measurement circuitry/means 20 configured to generate a first signal that represents a power of the received signal based on the received signal, and to generate a second signal that represents a power of an amplified signal based on the digital pre-distortion feedback signal. The amplified signal is a signal that is amplified by a power amplifier of the external transceiver device.

Figure 2C:
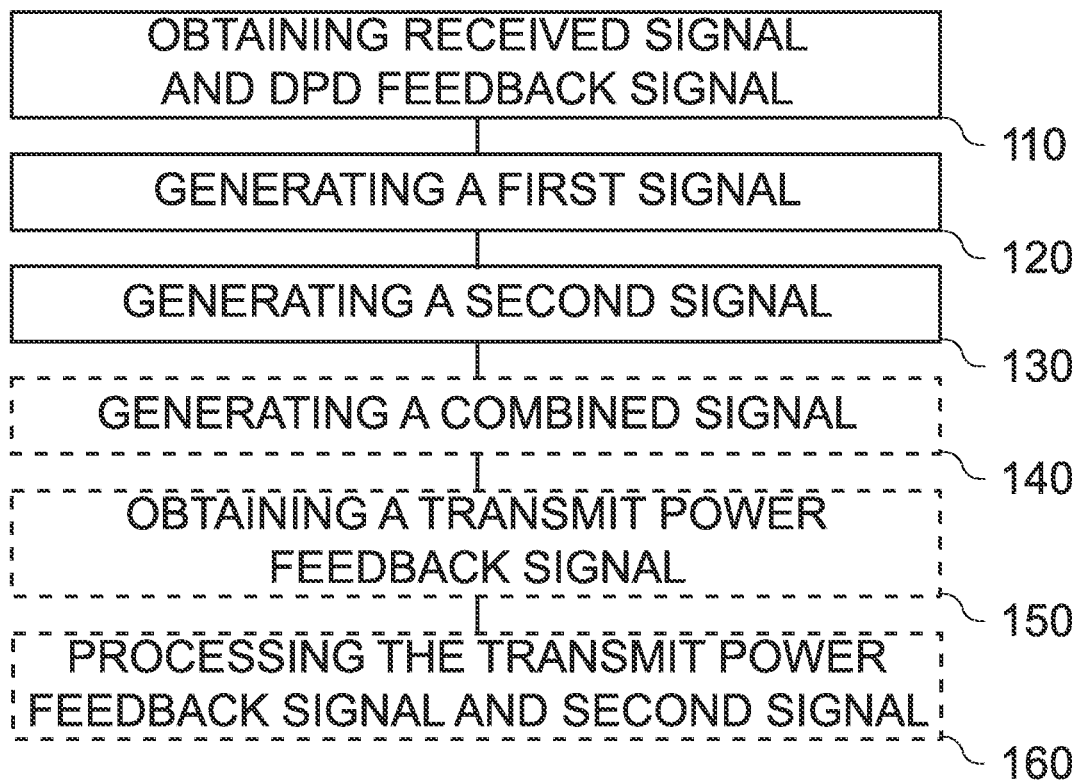
FIG. 2c shows a flow chart of an example of a radio-frequency frontend method.

FIG. 2c shows a flow chart of an example of a corresponding radio-frequency frontend method. The radio-frequency frontend method comprises obtaining 110 the received signal and the digital pre-distortion feedback signal from the external transceiver device. The radio-frequency frontend method comprises generating 120 the first signal that represents a power of the received signal based on the received signal. The radio-frequency frontend method comprises generating 130 the second signal that represents a power of the amplified signal based on the digital pre-distortion feedback signal.

Figure 2D:
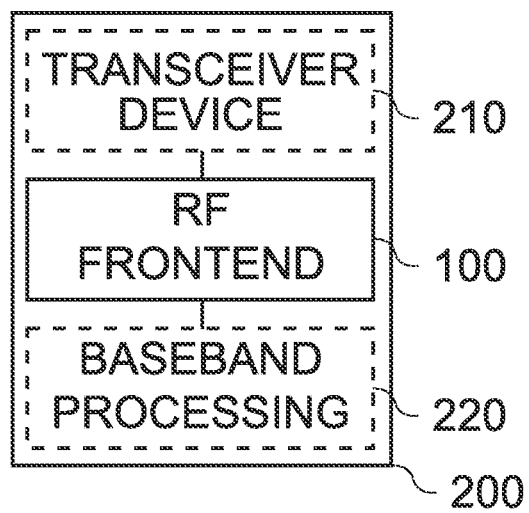
FIG. 2d shows a block diagram of an example of a transceiver apparatus or transceiver device.

FIG. 2d shows a block diagram of an example of a transceiver apparatus or transceiver device 200 comprising the radio-frequency frontend apparatus/device 100. In various examples, the transceiver apparatus/device may comprise the external transceiver device 210. The transceiver apparatus/device may further comprise a baseband processing apparatus 220. For example, the transceiver apparatus or transceiver device may be a transceiver apparatus or transceiver device for wireless communication. Accordingly, the transceiver apparatus or transceiver device may comprise an antenna or a connector for an antenna. For example, the transceiver apparatus may be a Wi-Fi transceiver apparatus, e.g. a transceiver apparatus for communicating according to a variant of the IEEE 802.11 standard.

The following description relates to the radio-frequency frontend apparatus/device 100, the corresponding method (and suitable computer program), and the transceiver device 200 comprising the radio-frequency frontend apparatus/device 100.

Various examples relate to an apparatus, device and method that re-uses a DPD feedback signal in order to derive information on a power of a signal being output by an external PA. Such an apparatus, device or method can be used as a RF-frontend together with an external transceiver device (e.g. FEM) that lacks circuitry for determining a separate TSSI signal. For example, various examples of the present disclosure may be used with external transceiver devices that are implemented similar to the FEM of FIG. 1d, which lacks an additional coupler and power detector (PDET) for generating the TSSI signal, e.g. compared to FIG. 1c. Various examples may, however, also be used with an external transceiver device as shown in FIG. 1c, and may or may not use the TSSI signal being provided by the TSSI. In this case, the TSSI signal that is provided by the PDET of the external transceiver device may be used instead of the second signal being generated within the radio-frequency frontend apparatus, the second signal may be used instead of the TSSI signal that is provided by the PDET, or both signals may be processed and used together. Accordingly, the external transceiver device 210 may be implemented similar to the FEMs of FIG. 1d or 1c, and may comprise the PA, the LNA, a connection structure for (alternatingly) connecting to the antenna, and a coupler for coupling out a copy of the amplified signal for the DPD. In addition, the external transceiver device 210 may comprise power measurement circuitry (a power detector) for generating a transmit power feedback signal (i.e. the TSSI signal), which may also be provided to the radio-frequency frontend apparatus.

Figure 4:
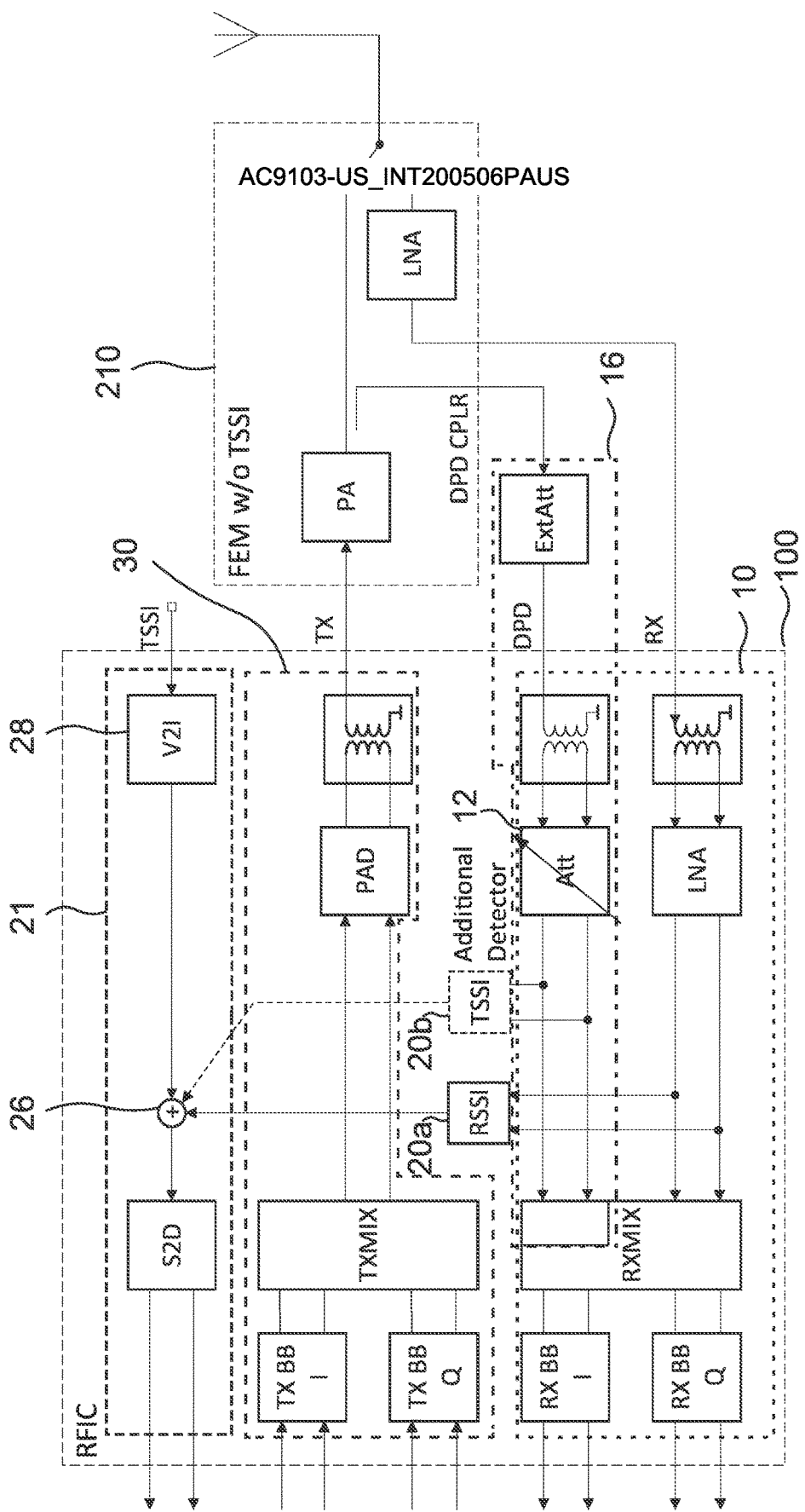
FIG. 4 shows a schematic diagram of an example of a radio-frequency frontend with power-measurement circuitry for generating a TSSI signal.
Figure 5A:
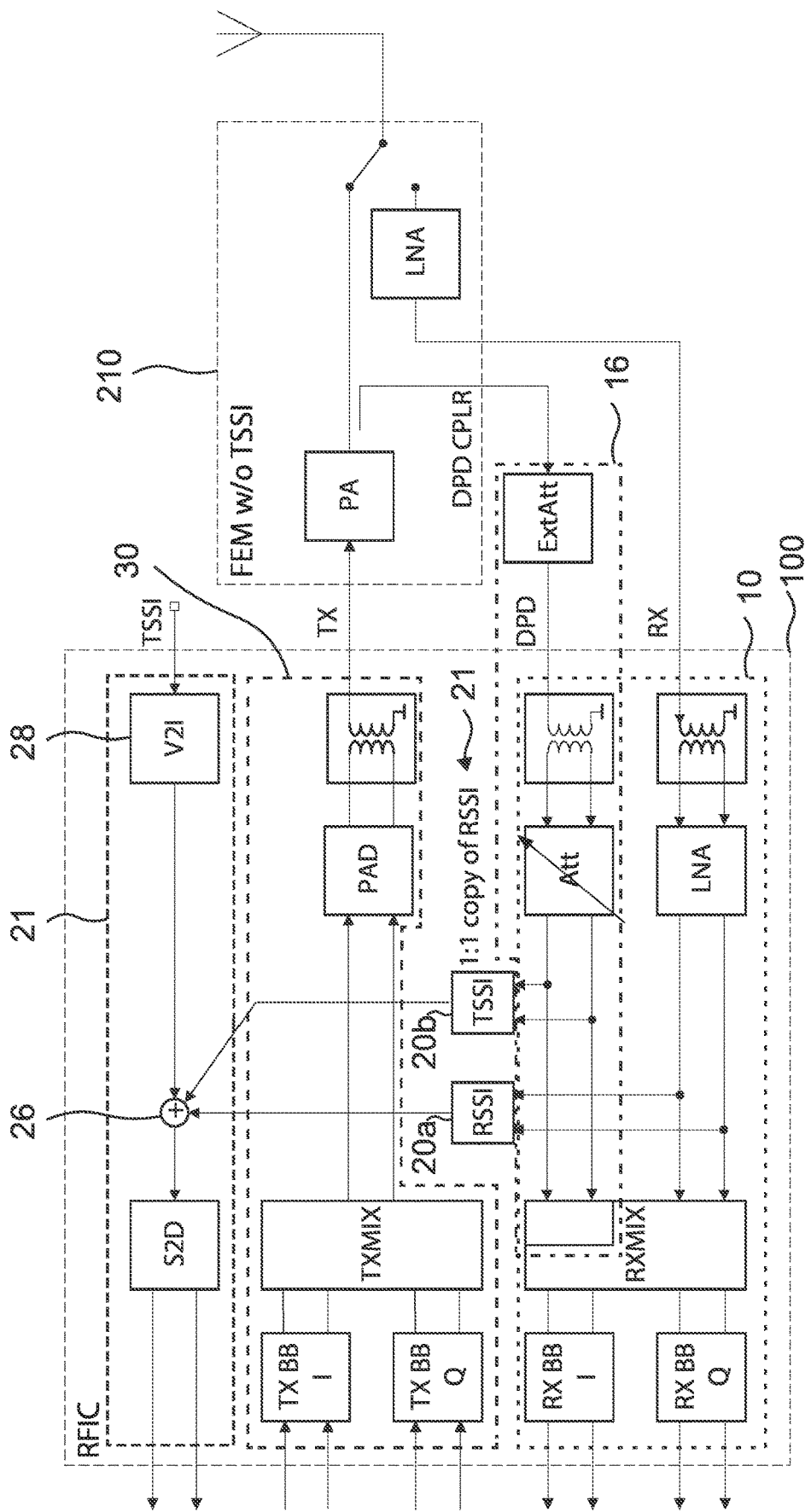
FIGS. 5a to 5c show schematic diagrams of examples of radio-frequency frontends with power-measurement circuitry for generating a TSSI signal.
Figure 5B:
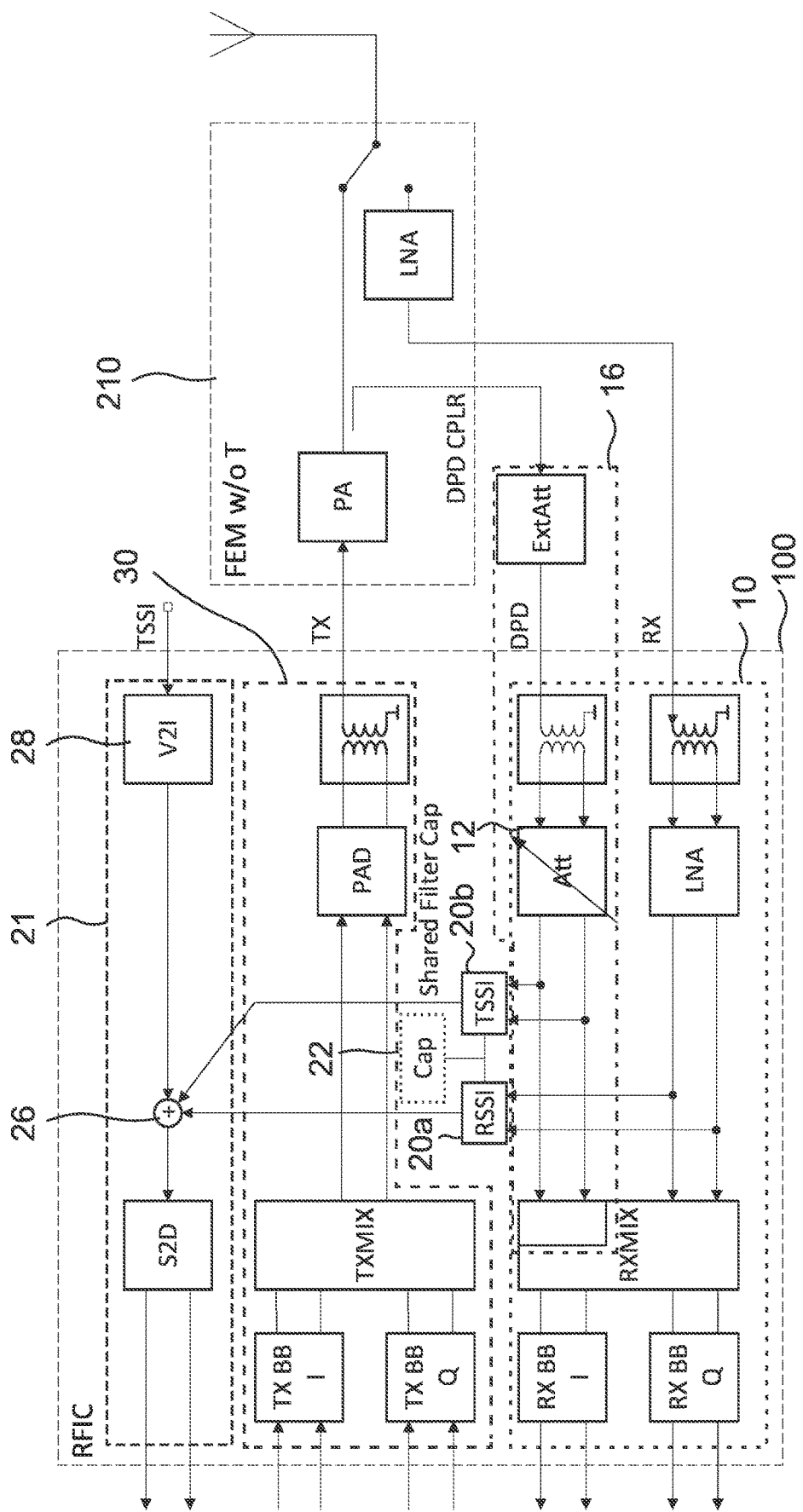
Figure 5C:
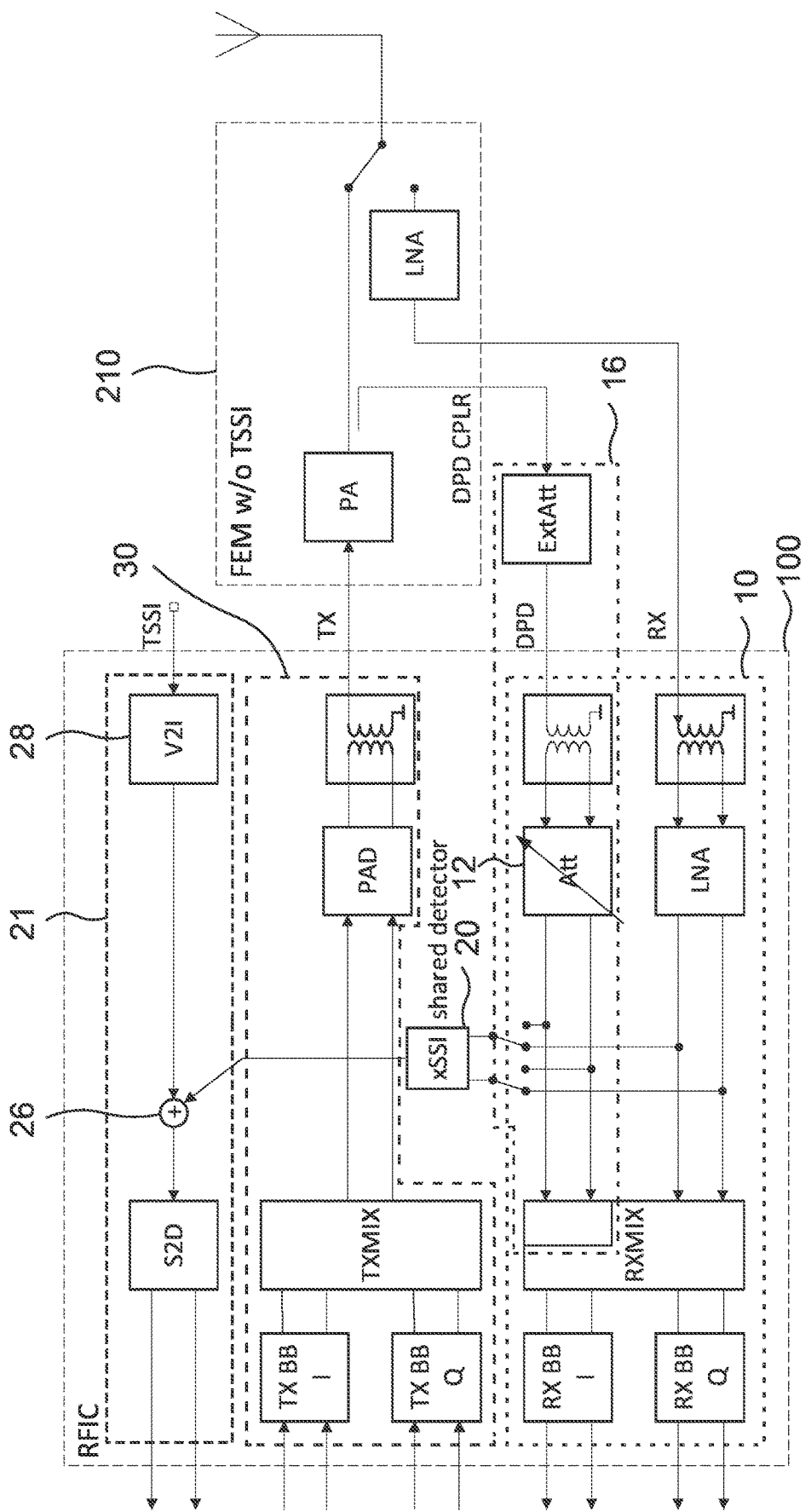

The radio-frequency frontend apparatus comprises the receive branch 10, which comprises circuitry/means configured to obtain the received signal and the digital pre-distortion feedback signal from the external transceiver device 210. In general, the circuitry/means of the receive branch may be configured to process the received signal and the digital pre-distortion feedback signal. For example, the circuitry/means of the receive branch may comprise mixer circuitry/mixer means for down-mixing the received signal and the digital pre-distortion feedback signal. As shown, e.g. in FIGS. 4 to 5c, the circuitry/means of the receive branch may comprise a (second) LNA for amplifying the received signal, and/or a variable/attenuator 12 for attenuating the digital pre-distortion feedback signal. In general, the received signal is the signal that is received via the external transceiver device, amplified by the LNA of the external transceiver device, and optionally by the LNA of the radio-frequency frontend apparatus. For example, the power measurement circuitry may be configured to generate the first signal based on the received signal after amplification by the second LNA. The digital pre-distortion feedback signal may be a copy of the amplified signal that is provided by a coupler of the external transceiver device. The digital pre-distortion feedback signal may be a signal that is to be used for digital pre-distortion by the baseband processing device. The digital pre-distortion feedback signal may be attenuated by one or more attenuators, e.g. by an external attenuator and/or by the variable attenuator 12, as shown in FIGS. 4 to 5c, for example. For example, the components that are configured to process the digital pre-distortion feedback signal may be grouped 16 in FIGS. 4 to 5c, including the external attenuator. The circuitry/means of the receive branch may be configured to provide the signals processed by the circuitry/means of the receive branch to the baseband processing apparatus.

For example, the baseband processing apparatus may be an apparatus for generating the signal to be transmitted in the baseband, and for processing the received signal in the baseband. The signal to be transmitted that is generated by the baseband processing apparatus may be upmixed by the radio-frequency frontend apparatus to a radio-frequency band, and provided to the external transceiver device in the radio-frequency band. In the reverse direction, the received signal, and the digital pre-distortion feedback signal may be downmixed to the baseband by the radio-frequency frontend apparatus, and provided to the baseband processing apparatus. For example, the DPD and closed-loop control of the TX power may be performed by the baseband processing apparatus.

As shown in FIG. 2b, the radio-frequency frontend apparatus/device 100 may further comprise a transmit branch 30 comprising circuitry/means configured to process the signal to be transmitted. As mentioned before, the circuitry/means of the transmit branch may be configured to obtain the signal to be transmitted from a baseband processing apparatus. For example, as shown in FIGS. 4 to 5c, the transmit branch may comprise mixer circuitry/means configured to upmix the signal to be transmitted to the radio-frequency band. The transmit branch may comprise driver circuitry for performing pre-amplification on the signal to be transmitted. The transmit branch may comprise circuitry/means configured to provide the signal to be transmitted to the power amplifier of the external transceiver device.

The radio-frequency frontend apparatus comprises the power measurement circuitry/means 20, which is configured to generate the first signal that represents the power of the received signal based on the received signal, and to generate the second signal that represents the power of the amplified signal based on the digital pre-distortion feedback signal. The power measurement circuitry may comprise circuitry for measuring the power of the respective signals, i.e. to generate a signal (e.g. a current signal) that is indicative of the power of the respective signal. In general, the first signal may be referenced as RSSI signal, and the second signal may be referenced as TSSI signal. Both signals may be current signals, i.e. a current of the first signal may represent the power of the received signal, and a current of the second signal may represent the power of the amplified signal.

In various examples, the generation of the signals may be mutually exclusive—either the first signal might be generated, or the second signal, or either the first signal might comprise a current representing the power of the received signal, or the second signal might comprise a current representing the power of the amplified signal. For example, the radio-frequency frontend apparatus/method may be suitable for time-division duplex (TDD) communication. Accordingly, the radio-frequency frontend apparatus/method may alternate between a transmit operation state and a receive operation state. The power measurement circuitry/means may be configured to (only) generate the first signal in the receive operation state (or to generate the second signal comprising zero current in the receive operation state), and to generate (only) the second signal in the transmit operation state (or to generate a first signal comprising zero current in the transmit operation state). Accordingly, the first signal may be generated (only) in the receive operation state, and the second signal may be generated (only) in the transmit operation state.

There are various approaches for implementing the power measurement circuitry/means. For example, as shown in FIGS. 4, 5a and 5b, the power measurement circuitry/means may comprise at least partially separate circuitry/means for generating the first signal and for generating the second signal. In other words, a portion of the power measurement circuitry might only be used for power measurement of the received signal (and not of the digital pre-distortion feedback signal), and a portion of the power measurement circuitry might only be used for power measurement of the digital pre-distortion feedback signal (and not of the received signal). For example, the radio-frequency frontend apparatus/device or the power measurement circuitry 20 may comprise first power measurement circuitry/means 20a for generating the first signal and separate second power measurement circuitry/means 20b for generating the second signal. In other words, the first signal may be generated using first power measurement circuitry and the second signal may be generated using separate second power measurement circuitry. For example, the first power measurement circuitry/means 20a and the second power measurement circuitry/means 20b may be implemented similarly, e.g. using the same Intellectual Property (IP) block, or using identical structural components.

In some examples, since the two signals may be generated mutually exclusively, some re-use of the circuitry may be possible. For example, a capacitor array being used by the power measurement circuitry may be shared among the first and second power measurement circuitry. For example, as shown in FIG. 5b, the radio-frequency frontend apparatus/device may comprise a plurality of capacitors/capacitive storage means 22. The first power measurement circuitry/means and the second power measurement circuitry/means may be configured to share the plurality of capacitors. In other words, the plurality of capacitors may be multiplexed between the first and the second power measurement circuitry.

In some examples, the power measurement circuitry may be multiplexed between generating the first signal and generating the second signal, e.g. by switching the inputs of the power measurement circuitry between the received signal and the digital pre-distortion feedback signal. Such an example is shown in FIG. 5c. Accordingly, the radio-frequency frontend apparatus/device or power measurement circuitry/means 20 may comprise control circuitry/means 24 configured to control the power measurement circuitry/ means. The control circuitry/means may be configured to alternate between providing the received signal and providing the digital pre-distortion feedback signal to the power measurement circuitry/means. Accordingly, the power measurement circuitry/means may be configured to alternatingly generate the first signal or the second signal based on the provided signal. In other words, the same power measurement circuitry may be used to alternatingly generate the first signal or the second signal. In FIGS. 2b, and 4 to 5c, the various components being used to generate or process the first and/or second signal or a combined signal, which will be introduced in the following, are logically grouped together by box 21.

As mentioned before, the first and second signal may be combined and provided to the baseband processing device in combined form. For example, the radio-frequency frontend apparatus/device may comprise combination circuitry/means 26 configured to generate a combined signal based on the first signal and based on the second signal. Accordingly, the method may comprise generating 140 the combined signal based on the first signal and based on the second signal. As mentioned above, the combined signal may be based alternatingly on the first signal or on the second signal. The combination circuitry/means may be configured to combine the first and second signals using the currents of the respective signals. In other words, the first and second signals may be combined using the currents of the respective signals. For example, the current of the combined signal may alternatingly represent the power of the received signal and the power of the amplified signal. Such a combination circuitry/means is also shown in FIGS. 4 to 5c as summing node 26. Accordingly, the combination circuitry may be a summing node. Alternatively, the combination circuitry may be a selection node, configured to include alternatingly the first signal or the second signal (or a transmit power feedback signal or a signal related to the power of the amplified signal as will be introduced in the following).

In some examples, the FEM may be equipped with separate power measurement circuitry for generating the TSSI signal. In this case, this signal may be used instead of, or in addition to, the second signal, or the signal may be disregarded. The radio-frequency frontend apparatus may comprise circuitry/means 28 for obtaining a transmit power feedback signal from the external transceiver device. Accordingly, the method may comprise obtaining 150 the transmit power feedback signal from the external transceiver device. For example, the transmit power feedback signal may represent the power of the amplified signal, and may be provided by power measurement circuitry of the external transceiver device. In this case, the combination circuitry/ means may be configured to generate the combined signal based on the first signal, the second signal and the obtained transmit power feedback signal. In other words, the combined signal may be generated based on the first signal, the second signal and the obtained transmit power feedback signal.

As mentioned above, in some examples, the transmit power feedback signal may be used instead of the second signal. For example, the combination circuitry/means may be configured to select one of the second signal and the transmit power feedback signal for the combined signal. In other words, one of the second signal and the transmit power feedback signal may be selected for the combined signal. For example, the combination circuitry may be configured to select the transmit power feedback signal if available, and the second signal instead. In this case, the power measurement circuitry might be instructed to forego generating the second signal.

Alternatively, both signals may be processed and used together. Accordingly, the combination circuitry/means may be configured to process the second signal and the transmit power feedback signal to determine a signal related to the power of the amplified signal, and to generate the combined signal based on the first signal and based on the signal related to the power of the amplified signal. In other words, the method may comprise processing 160 the second signal and the transmit power feedback signal to determine a signal related to the power of the amplified signal, and generating 140 the combined signal based on the first signal and based on the signal related to the power of the amplified signal. For example, the combination circuitry may be configured to generate a (weighted) average of the second signal and transmit power feedback signal to determine the signal related to the power of the amplified signal.

In some cases, the variable attenuator 12 for attenuating the digital pre-distortion feedback signal may be tuned to the expected power of the amplified signal, e.g. to reduce the required dynamic range of the power measurement circuitry. Accordingly, the control circuitry/means 24 being configured to control the variable attenuator based on an expected power of the amplified signal. Accordingly, the method may comprise controlling a variable attenuator based on an expected power of the amplified signal. For example, the control circuitry/means 24 may be configured to change the attenuation provided by the variable attenuator to achieve a desired output power range at the output of the variable attenuator. The power measurement circuitry may be configured to generate the second signal based on the expected power of the amplified signal as well, e.g. to compensate for the variable attenuation being provided by the variable attenuator.

More details and aspects of the radio-frequency frontend apparatus, device or method, and of the transceiver device are mentioned in connection with the proposed concept or one or more examples described above or below (e.g. FIG. 1*a* to 1*d*, 3 to 5*c*). The radio-frequency frontend apparatus, device or method, and the transceiver device may comprise one or more additional optional features corresponding to one or more aspects of the proposed concept or one or more examples described above or below.

Figure 3:
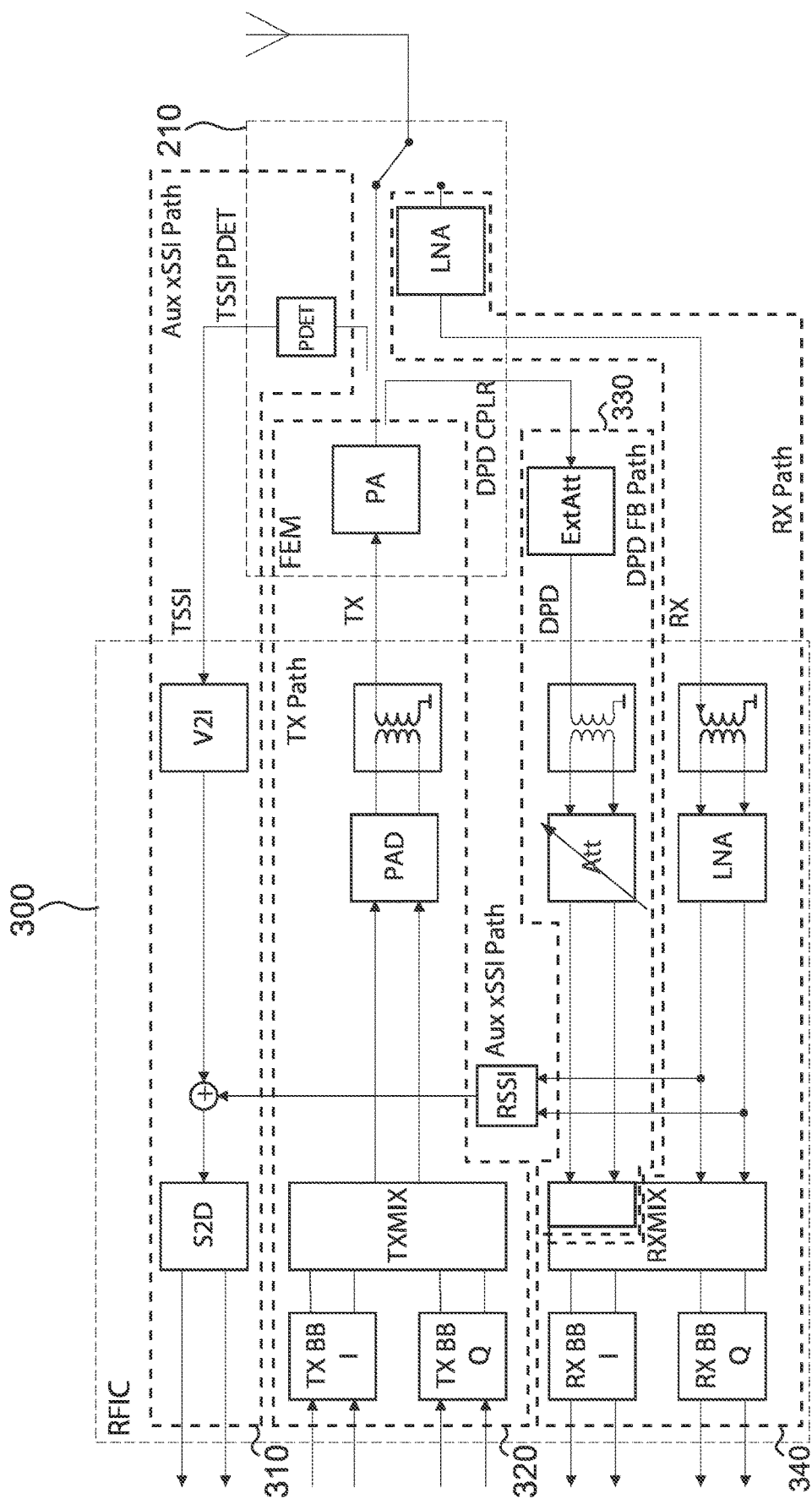
FIG. 3 shows a schematic diagram of an example of a radio-frequency frontend.

Digital pre-distortion in closed-loop operation is not yet a common feature for WiFi. However, a few FEMs exist for IEEE 802.11ac (Institute of Electrical and Electronics Engineers standard 802.11ac) and early 11ax for the 5 GHz and 2.4 GHz range with both, TSSI and DPD coupler output, as shown in FIG. 3. FIG. 3 shows a schematic diagram of an example of a radio-frequency frontend. FIG. 3 shows an implementation of an RFIC 300 with a DPD FB (Feedback) input, which is coupled to an external Front-End Module FEM 210. In FIG. 3, and similarly in FIGS. 4 and 5*a* to 5*c*, four groups of components are shown—an auxiliary xSSI (RSSI and/or TSSI) path 310, a TX path 320, a DPD FB path 330 and an RX path 340. The auxiliary xSSI (RSSI and/or TSSI) path 310 comprises RSSI power measurement circuitry, a PDET block (which is part of the FEM), a V2I (Voltage-to-Current amplifier or converter) block, combination circuitry and a S2D block. The RSSI power measurement circuitry is configured to generate an RSSI signal based on a differential output of a (second) LNA of the RX path. The PDET (Power Detection) block is configured to generate a TSSI signal based on a copy amplified signal that is provided by a Power Amplifier (which is part of the FEM) of the TX Path, the copy of the amplified signal being accessed via a coupler. The V2I block is configured to convert the TSSI signal from a voltage signal to a current signal. The combination circuitry is configured to combine the output of the V2I block and the RSSI signal. And the S2D (Single-to-Differential) block is configured to generate a differential signal based on the output of the combination circuitry. The TX path 320 comprises input circuitry for obtaining a differential TX Baseband (BB) I and input circuitry for obtaining a differential TX BB Q signal. The TX path 320 further comprises mixer circuitry TXMIX configured to upmix the TX BB I and Q signals. The TX path 320 further comprises a power amplifier driver PAD for providing a pre-amplification of the upmixed signals, and a differential-to-single coupler configured to convert the output of the PAD (as TX signal) to the PA of the TX path. The RX path 340 comprises a first LNA, which is part of the FEM block. The RX path 340 further comprises a single-to-differential coupler, which is configured to convert the output of the first LNA into a differential signal, with the second LNA being configured to amplify the output of the single-to-differential coupler. The RX path 340 further comprises mixer circuitry RXMIX configured to downmix the output of the second LNA. The RX path 340 further comprises output circuitry for providing the down-mixed RX BB I and Q signals to the baseband module. The DPD FB path 330 shares the RXMIX and the output circuitry with the RX path. The DPD FB path 330 comprises an external attenuator, which is external to both the FEM 210 and the RFIC 300, which is configured to attenuate a copy (DPD CPLR) of the amplified signal that is accessed via another coupler. The output DPD of the external attenuator is provided to a single-to-differential coupler, which provides a differential signal to a variable attenuator. The variable attenuator is configured to provide a differential signal to RXMIX, which is configured to down-mix the output of the variable attenuator and to provide it to the baseband module via the output circuitry. The amplified signal is provided to an antenna, which is multiplexed between the PA and the LNA depending on the mode of operation (TX or RX).

Compared with the RFIC shown in FIG. 3, in various examples, an additional analog power detector may be placed at a suitable RF node in the DPD feedback path, or the RSSI power detector may be re-used for TSSI detection. The output of the additional detector may be connected to the summing node (combination circuitry) of the common xSSI path, which may be used for regular transmit signal strength indication during TX operation and receive signal strength indication during RX operation. The concept is shown in FIG. 4.

FIG. 4 shows a schematic diagram of an example of a radio-frequency frontend with power-measurement circuitry for generating a TSSI signal. FIG. 4 may show an RFIC with an additional SSI detector in DPD FB path. For example, the RF frontend of FIG. 4, and of FIGS. 5*a* to 5*c*, may be implemented similar to the RF frontend of FIG. 3. In addition to the RFIC shown in FIG. 3, the RFIC 100 of FIG. 4 comprises additional power measurement circuitry 20*b* for generating the TSSI current signal within the RFIC, which is provided to the summing node (combination circuitry) as an alternative to the input by the V2I (which may correspond to the interface circuitry 28 introduced in connection with FIG. 2*b*). For example, the summing node may correspond to the combination circuitry 26 of FIG. 2*b*. The RSSI power measurement circuitry may correspond to a first power measurement circuitry 20*a* and the TSSI power measurement circuitry may correspond to a second power measurement circuitry 20b, which may implement the power measurement circuitry 20 of FIGS. 2a and/or 2b. In FIG. 4, the different branches, as used in connection with FIGS. 2a and/or 2b, are overlaid over the components of the RFIC of FIG. 4 that are not part of the FEM 210 (which does not include TSSI measurement circuitry). For example, the power measurement branch 21 may comprise the components of the auxiliary xSSI path that are internal to the RFIC (including the power measurement circuitry 20a; 20b), the TX branch 30 may comprise the components of the TX path that are internal to the RFIC, the RX branch 10 may comprise the components of the RX path that are internal to the RFIC, and the DPD branch 16 may comprise the components of the DPD FB path, including the external attenuator.

The DPD feedback path then serves two purposes: During DPD calibration, the RF signal at the DPD feedback input may be received over the variable/programmable attenuator and dedicated mixer slices (of RXMIX), then connected to the regular RX baseband path. The additional power detector may remain in power-down or standby mode. During TX operation, the additional power detector may be set to active mode while the DPD mixer slices are switched off. The power of the RF signal at the DPD feedback input may be measured with the additional power detector. The detector output may be connected to the common xSSI path and processed the same way as a TSSI signal coming directly from the FEM.

In general, this approach may allow a direct usage of FEMs with an integrated PA coupler for DPD, but without integrated TSSI detector, with no negative impact on TX power accuracy, power consumption, and DPD calibration accuracy. Third-party FEM vendors may be able to provide future-proof DPD-compatible FEMs with reduced design effort, better performance, reduced cost, at a faster-to-market schedule.

Compared to other approaches to deal with FEMs without an integrated TSSI detector, the proposed approach provides several advantages: Power consumption may be reduced compared to a power detection in the digital baseband, since the major part of the RX path can remain switched off during TX operation. This may help with the stringent requirements of the Code of Conduct on Energy Consumption. The additional power detector may be a simple copy of the RSSI detector, which may reduce design and layout efforts to a minimum. Area-consuming parts, like a capacitor bank for filtering the detector output may be shared among the two detectors. Depending on layout and isolation requirements, even a single, shared detector may be used for both, RSSI and TSSI. Clever usage of the attenuator in front of the power detector may allow to reduce the dynamic range requirements, and further relax design efforts, power consumption etc. Using the same detector type for TSSI and RSSI may applying the same post-processing, conversion, and interpolation methods. This may reduce efforts for a FW (Firmware) implementation.

The additional power detector may provide a further advantage when configuring the RFIC for DPD calibration. For each calibration run, the DPD feedback path gains may be adjusted to the PA output power under test to reduce or minimize nonlinear effects in the feedback path. One target parameter to meet in this gain optimization process is the signal power at the RX Mixer input. Instead of relying on nominal gains for the RFIC-integrated programmable attenuator, the external attenuator, the DPD coupler attenuation and assumptions on the losses in between, the power at this sensitive node may be measured directly. This may allow reducing margins and apply a more aggressive gain training for improved SNDR (Signal-to-Noise-Plus-Distortion Ratio) in the feedback paths and higher accuracy in the DPD model fitting.

FIGS. 5a to 5c show schematic diagrams of examples of radio-frequency frontends with power-measurement circuitry for generating a TSSI signal.

A first implementation may be to place a 1:1 copy 20b of the RSSI detector 20a at the output of the DPD FB attenuator 12, as shown in FIG. 5a. FIG. 5a shows an implementation variant with 1:1 copy of RSSI power detector.

Depending on layout restrictions, supply sharing and isolation requirements, (at least) two more implementation variants may further reduce the area increase. For example, two separate detectors 20a; 20b may share the most-area consuming part in the xSSI design, namely the capacitor block 22 for filtering the detector output, as shown in FIG. 5b. FIG. 5b shows an implementation variant with a partly shared power detector.

Alternatively, a single detector 20 may be shared between the two paths, and detector inputs may be switched depending on the operation mode, Regular RX mode or TX mode/DPD calibration, as illustrated in FIG. 5c. FIG. 5c shows an implementation variant with a single power detector.

More details and aspects of the proposed concept are mentioned in connection with the proposed concept or one or more examples described above or below (e.g. FIG. 1a to 2d). The proposed concept may comprise one or more additional optional features corresponding to one or more aspects of the proposed concept or one or more examples described above or below.

The aspects and features described in relation to a particular one of the previous examples may also be combined with one or more of the further examples to replace an identical or similar feature of that further example or to additionally introduce the features into the further example.

Example 1 relates to a radio-frequency frontend apparatus (100), comprising a receive branch (10), comprising circuitry configured to obtain a received signal and a digital pre-distortion feedback signal from an external transceiver device (210). The radio-frequency frontend apparatus (100) comprises power measurement circuitry (20; 20a; 20b; 21; 22) configured to generate a first signal that represents a power of the received signal based on the received signal, and to generate a second signal that represents a power of an amplified signal based on the digital pre-distortion feedback signal, the amplified signal being a signal that is amplified by a power amplifier of the external transceiver device.

In Example 2, the subject matter of example 1 or any of the Examples described herein may further include, that the radio-frequency frontend apparatus comprises combination circuitry (26) configured to generate a combined signal based on the first signal and based on the second signal.

In Example 3, the subject matter of example 2 or any of the Examples described herein may further include, that the combined signal is based alternatingly on the first signal or on the second signal.

In Example 4, the subject matter of one of the examples 2 to 3 or any of the Examples described herein may further include, that the combination circuitry is configured to combine the first and second signals using the currents of the respective signals.

In Example 5, the subject matter of one of the examples 2 to 4 or any of the Examples described herein may further include, that the radio-frequency frontend apparatus comprises circuitry (28) for obtaining a transmit power feedback signal from the external transceiver device, the combination circuitry being configured to generate the combined signal based on the first signal, the second signal and the obtained transmit power feedback signal.

In Example 6, the subject matter of example 5 or any of the Examples described herein may further include, that the combination circuitry is configured to select one of the second signal and the transmit power feedback signal for the combined signal.

In Example 7, the subject matter of example 5 or any of the Examples described herein may further include, that the combination circuitry is configured to process the second signal and the transmit power feedback signal to determine a signal related to the power of the amplified signal, and to generate the combined signal based on the first signal and based on the signal related to the power of the amplified signal.

In Example 8, the subject matter of one of the examples 1 to 7 or any of the Examples described herein may further include, that the radio-frequency frontend apparatus comprises first power measurement circuitry (20a) for generating the first signal and separate second power measurement circuitry (20b) for generating the second signal.

In Example 9, the subject matter of example 8 or any of the Examples described herein may further include, that the radio-frequency frontend apparatus comprises a plurality of capacitors (22), wherein the first power measurement circuitry and the second power measurement circuitry are configured to share the plurality of capacitors.

In Example 10, the subject matter of one of the examples 1 to 9 or any of the Examples described herein may further include, that the radio-frequency frontend apparatus comprises control circuitry (24) configured to control the power measurement circuitry, the control circuitry being configured to alternate between providing the received signal and providing the digital pre-distortion feedback signal to the power measurement circuitry, the power measurement circuitry being configured to alternatingly generate the first signal or the second signal based on the provided signal.

In Example 11, the subject matter of one of the examples 1 to 10 or any of the Examples described herein may further include, that the radio-frequency frontend apparatus is suitable for time-division duplex communication, alternating between a transmit operation state and a receive operation state, wherein the power measurement circuitry is configured to generate the first signal in the receive operation state, and to generate the second signal in the transmit operation state.

In Example 12, the subject matter of one of the examples 1 to 11 or any of the Examples described herein may further include, that the receive branch comprises a variable attenuator (12) for attenuating the digital pre-distortion feedback signal, the radio-frequency frontend apparatus comprising control circuitry (24) being configured to control the variable attenuator based on an expected power of the amplified signal.

In Example 13, the subject matter of one of the examples 1 to 12 or any of the Examples described herein may further include, that the circuitry of the receive branch is configured to process the received signal and the digital pre-distortion feedback signal.

In Example 14, the subject matter of example 13 or any of the Examples described herein may further include, that the circuitry of the receive branch is configured to provide the signals processed by the circuitry of the receive branch to a baseband processing apparatus.

In Example 15, the subject matter of one of the examples 1 to 14 or any of the Examples described herein may further include, that the radio-frequency frontend apparatus comprises a transmit branch (30) comprising circuitry configured to process a signal to be transmitted, and to provide the signal to be transmitted to the power amplifier of the external transceiver device.

In Example 16, the subject matter of one of the examples 1 to 15 or any of the Examples described herein may further include, that the circuitry of the transmit branch is configured to obtain the signal to be transmitted from a baseband processing apparatus.

Example 17 relates to a transceiver apparatus (200) comprising the radio-frequency frontend apparatus (100) according to one of the examples 1 to 16.

In Example 18, the subject matter of example 17 or any of the Examples described herein may further include, that the transceiver apparatus comprises the external transceiver device (210).

In Example 19, the subject matter of one of the examples 17 to 18 or any of the Examples described herein may further include, that the transceiver apparatus comprises a baseband processing apparatus (220).

In Example 20, the subject matter of one of the examples 17 to 19 or any of the Examples described herein may further include, that the transceiver apparatus is a Wi-Fi transceiver apparatus.

Example 21 relates to a radio-frequency frontend device (100), comprising a receive branch (10), comprising means configured to obtain a received signal and a digital pre-distortion feedback signal from an external transceiver device (210). The radio-frequency frontend device (100) comprises power measurement means (20; 20a; 20b; 21; 22) configured to generate a first signal that represents a power of the received signal based on the received signal, and to generate a second signal that represents a power of an amplified signal based on the digital pre-distortion feedback signal, the amplified signal being a signal that is amplified by a power amplifier of the external transceiver device.

In Example 22, the subject matter of example 21 or any of the Examples described herein may further include, that the radio-frequency frontend device comprises combination means (26) configured to generate a combined signal based on the first signal and based on the second signal.

In Example 23, the subject matter of example 22 or any of the Examples described herein may further include, that the combined signal is based alternatingly on the first signal or on the second signal.

In Example 24, the subject matter of one of the examples 22 to 23 or any of the Examples described herein may further include, that the combination means is configured to combine the first and second signals using the currents of the respective signals.

In Example 25, the subject matter of one of the examples 22 to 24 or any of the Examples described herein may further include, that the radio-frequency frontend device comprises means (28) for obtaining a transmit power feedback signal from the external transceiver device, the combination means being configured to generate the combined signal based on the first signal, the second signal and the obtained transmit power feedback signal.

In Example 26, the subject matter of example 25 or any of the Examples described herein may further include, that the combination means is configured to select one of the second signal and the transmit power feedback signal for the combined signal.

In Example 27, the subject matter of example 25 or any of the Examples described herein may further include, that the combination means is configured to process the second signal and the transmit power feedback signal to determine a signal related to the power of the amplified signal, and to generate the combined signal based on the first signal and based on the signal related to the power of the amplified signal.

In Example 28, the subject matter of one of the examples 21 to 27 or any of the Examples described herein may further include, that the radio-frequency frontend device comprises first power measurement means (20a) for generating the first signal and separate second power measurement means (20b) for generating the second signal.

In Example 29, the subject matter of example 28 or any of the Examples described herein may further include, that the radio-frequency frontend device comprises a plurality of capacitors (22), wherein the first power measurement means and the second power measurement means are configured to share the plurality of capacitors.

In Example 30, the subject matter of one of the examples 21 to 29 or any of the Examples described herein may further include, that the radio-frequency frontend device comprises control means (24) configured to control the power measurement means, the control means being configured to alternate between providing the received signal and providing the digital pre-distortion feedback signal to the power measurement means, the power measurement means being configured to alternatingly generate the first signal or the second signal based on the provided signal.

In Example 31, the subject matter of one of the examples 21 to 30 or any of the Examples described herein may further include, that the radio-frequency frontend device is suitable for time-division duplex communication, alternating between a transmit operation state and a receive operation state, wherein the power measurement means is configured to generate the first signal in the receive operation state, and to generate the second signal in the transmit operation state.

In Example 32, the subject matter of one of the examples 21 to 31 or any of the Examples described herein may further include, that the receive branch comprises a variable attenuator (12) for attenuating the digital pre-distortion feedback signal, the radio-frequency frontend device comprising control means (24) being configured to control the variable attenuator based on an expected power of the amplified signal.

In Example 33, the subject matter of one of the examples 21 to 32 or any of the Examples described herein may further include, that the receive branch is configured to process the received signal and the digital pre-distortion feedback signal.

In Example 34, the subject matter of example 33 or any of the Examples described herein may further include, that the receive branch is configured to provide the signals processed by the means of the receive branch to a baseband processing device.

In Example 35, the subject matter of one of the examples 21 to 34 or any of the Examples described herein may further include, that the radio-frequency frontend device comprises a transmit branch (30) comprising means configured to process a signal to be transmitted, and to provide the signal to be transmitted to the power amplifier of the external transceiver device.

In Example 36, the subject matter of one of the examples 21 to 35 or any of the Examples described herein may further include, that the transmit branch is configured to obtain the signal to be transmitted from a baseband processing device.

Example 37 relates to a transceiver device (200) comprising the radio-frequency frontend device (100) according to one of the examples 21 to 36.

In Example 38, the subject matter of example 37 or any of the Examples described herein may further include, that the transceiver device comprises the external transceiver device (210).

In Example 39, the subject matter of one of the examples 37 to 38 or any of the Examples described herein may further include, that the transceiver device comprises a baseband processing device (220).

In Example 40, the subject matter of one of the examples 37 to 39 or any of the Examples described herein may further include, that the transceiver device is a Wi-Fi transceiver device.

Example 41 relates to a radio-frequency frontend method, comprising obtaining (110) a received signal and a digital pre-distortion feedback signal from an external transceiver device. The radio-frequency frontend method comprises generating (120) a first signal that represents a power of the received signal based on the received signal. The radio-frequency frontend method comprises generating (130) a second signal that represents a power of an amplified signal based on the digital pre-distortion feedback signal, the amplified signal being a signal that is amplified by a power amplifier of the external transceiver device.

In Example 42, the subject matter of example 41 or any of the Examples described herein may further include, that the method comprises generating (140) a combined signal based on the first signal and based on the second signal.

In Example 43, the subject matter of example 42 or any of the Examples described herein may further include, that the combined signal is based alternatingly on the first signal or on the second signal.

In Example 44, the subject matter of one of the examples 42 to 43 or any of the Examples described herein may further include, that the first and second signals are combined using the currents of the respective signals.

In Example 45, the subject matter of one of the examples 42 to 44 or any of the Examples described herein may further include, that the method comprises obtaining (150) a transmit power feedback signal from the external transceiver device, wherein the combined signal is generated based on the first signal, the second signal and the obtained transmit power feedback signal.

In Example 46, the subject matter of example 45 or any of the Examples described herein may further include, that one of the second signal and the transmit power feedback signal is selected for the combined signal.

In Example 47, the subject matter of example 45 or any of the Examples described herein may further include, that the method comprises processing (160) the second signal and the transmit power feedback signal to determine a signal related to the power of the amplified signal, and generating (140) the combined signal based on the first signal and based on the signal related to the power of the amplified signal.

In Example 48, the subject matter of one of the examples 41 to 47 or any of the Examples described herein may further include, that the first signal is generated using first power measurement circuitry and wherein the second signal is generated using separate second power measurement circuitry.

In Example 49, the subject matter of one of the examples 41 to 48 or any of the Examples described herein may further include, that the same power measurement circuitry is used to alternatingly generate the first signal or the second signal.

In Example 50, the subject matter of one of the examples 41 to 49 or any of the Examples described herein may further include, that the radio-frequency frontend method is suitable for time-division duplex communication, alternating between a transmit operation state and a receive operation state, wherein the first signal is generated in the receive operation state, and the second signal is generated in the transmit operation state.

In Example 51, the subject matter of one of the examples 41 to 50 or any of the Examples described herein may further include, that the method comprises controlling a variable attenuator based on an expected power of the amplified signal.

Example 52 relates to a machine-readable storage medium including program code, when executed, to cause a machine to perform the method of one of the examples 41 to 51.

Example 53 relates to a computer program having a program code for performing the method of one of the examples 41 to 51, when the computer program is executed on a computer, a processor, or a programmable hardware component.

Example 54 relates to a machine-readable storage including machine readable instructions, when executed, to implement a method or realize an apparatus as claimed in any pending claim or shown in any example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A radio-frequency frontend apparatus, comprising:
a receive branch, comprising circuitry configured to obtain a received signal and a digital pre-distortion feedback signal from an external transceiver device; and
power measurement circuitry configured to generate a first signal that represents a power of the received signal based on the received signal, and to generate a second signal that represents a power of an amplified signal based on the digital pre-distortion feedback signal, the amplified signal being a signal that is amplified by a power amplifier of the external transceiver device.

2. The radio-frequency frontend apparatus according to claim 1, comprising combination circuitry configured to generate a combined signal based on the first signal and based on the second signal.

3. The radio-frequency frontend apparatus according to claim 2, wherein the combined signal is based alternatingly on the first signal or on the second signal.

4. The radio-frequency frontend apparatus according to claim 2, wherein the combination circuitry is configured to combine the first and second signals using the currents of the respective signals.

5. The radio-frequency frontend apparatus according to claim 2, comprising circuitry for obtaining a transmit power feedback signal from the external transceiver device, the combination circuitry being configured to generate the combined signal based on the first signal, the second signal and the obtained transmit power feedback signal.

6. The radio-frequency frontend apparatus according to claim 5, wherein the combination circuitry is configured to select one of the second signal and the transmit power feedback signal for the combined signal.

7. The radio-frequency frontend apparatus according to claim 5, wherein the combination circuitry is configured to process the second signal and the transmit power feedback signal to determine a signal related to the power of the amplified signal, and to generate the combined signal based on the first signal and based on the signal related to the power of the amplified signal.

8. The radio-frequency frontend apparatus according to claim 1, comprising first power measurement circuitry for generating the first signal and separate second power measurement circuitry for generating the second signal.

9. The radio-frequency frontend apparatus according to claim 8, comprising a plurality of capacitors, wherein the first power measurement circuitry and the second power measurement circuitry are configured to share the plurality of capacitors.

10. The radio-frequency frontend apparatus according to claim 1, comprising control circuitry configured to control the power measurement circuitry, the control circuitry being configured to alternate between providing the received signal and providing the digital pre-distortion feedback signal to the power measurement circuitry, the power measurement circuitry being configured to alternatingly generate the first signal or the second signal based on the provided signal.

11. The radio-frequency frontend apparatus according to claim 1, wherein the radio-frequency frontend apparatus is suitable for time-division duplex communication, alternating between a transmit operation state and a receive operation state, wherein the power measurement circuitry is configured to generate the first signal in the receive operation state, and to generate the second signal in the transmit operation state.

12. The radio-frequency frontend apparatus according to claim 1, wherein the receive branch comprises a variable attenuator for attenuating the digital pre-distortion feedback signal, the radio-frequency frontend apparatus comprising control circuitry being configured to control the variable attenuator based on an expected power of the amplified signal.

13. The radio-frequency frontend apparatus according to claim 1, wherein the circuitry of the receive branch is configured to process the received signal and the digital pre-distortion feedback signal.

14. The radio-frequency frontend apparatus according to claim 13, wherein the circuitry of the receive branch is configured to provide the signals processed by the circuitry of the receive branch to a baseband processing apparatus.

15. The radio-frequency frontend apparatus according to claim 1, comprising a transmit branch comprising circuitry configured to process a signal to be transmitted, and to provide the signal to be transmitted to the power amplifier of the external transceiver device.

16. The radio-frequency frontend apparatus according to claim 15, wherein the circuitry of the transmit branch is configured to obtain the signal to be transmitted from a baseband processing apparatus.

17. A transceiver apparatus comprising the radio-frequency frontend apparatus according to claim 1.

18. The transceiver apparatus according to claim 17, comprising the external transceiver device.

19. The transceiver apparatus according to claim 17, comprising a baseband processing apparatus.

20. The radio-frequency transceiver apparatus according to claim 17, wherein the transceiver apparatus is a Wi-Fi transceiver apparatus.

21. A radio-frequency frontend method, comprising:
obtaining a received signal and a digital pre-distortion feedback signal from an external transceiver device;
generating a first signal that represents a measured power of the received signal based on the received signal; and
generating a second signal that represents a measured power of an amplified signal based on the digital pre-distortion feedback signal, the amplified signal being a signal that is amplified by a power amplifier of the external transceiver device.

22. The radio-frequency frontend method according to claim 21, wherein the first signal is generated using first power measurement circuitry and wherein the second signal is generated using separate second power measurement circuitry.

23. The radio-frequency frontend method according to claim 21, wherein the same power measurement circuitry is used to alternatingly generate the first signal or the second signal.

* * * * *